(12) United States Patent
Tai et al.

(10) Patent No.: US 12,262,518 B2
(45) Date of Patent: Mar. 25, 2025

(54) SHIELDING COVER AND CIRCUIT BOARD ASSEMBLY

(71) Applicants: INVENTEC (PUDONG) TECHNOLOGY CORPORATION, Shanghai (CN); INVENTEC CORPORATION, Taipei (TW)

(72) Inventors: Yu Shu Tai, Taipei (TW); Chih-Cheng Li, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 18/236,891

(22) Filed: Aug. 22, 2023

(65) Prior Publication Data
US 2024/0407144 A1    Dec. 5, 2024

(30) Foreign Application Priority Data

Jun. 5, 2023    (CN) .......................... 202310658783.1

(51) Int. Cl.
*H05K 9/00*    (2006.01)

(52) U.S. Cl.
CPC ......... *H05K 9/0007* (2013.01); *H05K 9/0028* (2013.01)

(58) Field of Classification Search
CPC .................................................... H05K 9/0028
See application file for complete search history.

(56) References Cited

U.S. PATENT DOCUMENTS

| | | | | |
|---|---|---|---|---|
| 7,351,107 B1* | 4/2008 | Burlock | ............... | H01R 13/658 361/752 |
| 2010/0246143 A1* | 9/2010 | Dinh | ..................... | H05K 9/0028 29/729 |
| 2011/0299262 A1* | 12/2011 | Crotty | ................ | H01R 13/6271 361/818 |
| 2013/0153286 A1* | 6/2013 | Kim | ..................... | H05K 9/0007 29/829 |

* cited by examiner

*Primary Examiner* — Hung V Ngo
(74) *Attorney, Agent, or Firm* — Maschoff Brennan

(57) ABSTRACT

A circuit board assembly includes a circuit board, a noise source and a shielding cover. The circuit board has an upper surface, a lower surface and a plurality of grounding areas. The lower surface faces away from the upper surface, and the grounding areas are located at the lower surface. The noise source is located at the upper surface of the circuit board. The shielding cover includes a covering body and a plurality of elastic grounding arms. The covering body is in contact with the upper surface and covers the noise source. The elastic grounding arms are connected to the covering body. The elastic grounding arms are in contact with the lower surface of the circuit board and respectively in electrical contact with the grounding areas.

6 Claims, 4 Drawing Sheets

SHIELDING COVER AND CIRCUIT BOARD ASSEMBLY

CROSS-REFERENCE TO RELATED APPLICATIONS

This non-provisional application claims priority under 35 U.S.C. § 119 (a) on Patent Application No(s). 202310658783.1 filed in China, on Jun. 5, 2023, the entire contents of which are hereby incorporated by reference.

BACKGROUND OF THE INVENTION

Technical Field of the Invention

The invention relates to a shielding cover and a circuit board assembly, more particularly to a shielding cover capable of shielding noise and a circuit board assembly including the same.

Description of the Related Art

In general, an electronic component on a motherboard of an electronic device may generate noise during operation so as to adversely affect the operation of another electronic component (e.g., an antenna) of the electronic device. In order to prevent the noise from interfering the operation of the antenna, the current means is to use a shielding cap to cover a noise source on the motherboard.

Specifically, the shielding cap is fixed on the motherboard via a metal clamp (or frame) provided on the motherboard and is electrically connected to the motherboard via this metal clamp (or frame) for grounding. However, the metal clamp (or frame) are disposed on the motherboard via Surface Mount Technology, and thus the metal clamp (or frame) may limit the circuit layout of the motherboard. In addition, the arrangement of the metal clamp (or frame) may cause the burden of production and increase cost. Therefore, how to solve the aforementioned issues is one of the crucial topics in this field.

SUMMARY OF THE INVENTION

The invention provides a circuit board assembly and a shielding cover which are capable of preventing the circuit layout of the motherboard from being limited, reducing the burden of production and saving cost.

One embodiment of the invention provides a circuit board assembly. The circuit board assembly includes a circuit board, a noise source and a shielding cover. The circuit board has an upper surface, a lower surface and a plurality of grounding areas. The lower surface faces away from the upper surface, and the grounding areas are located at the lower surface. The noise source is located at the upper surface of the circuit board. The shielding cover includes a covering body and a plurality of elastic grounding arms. The covering body is in contact with the upper surface and covers the noise source. The elastic grounding arms are connected to the covering body. The elastic grounding arms are in contact with the lower surface of the circuit board and respectively in electrical contact with the grounding areas.

Another embodiment of the invention provides a shielding cover. The shielding cover is configured to cover a noise source on a circuit board. The shielding cover includes a covering body and a plurality of elastic grounding arms. The covering body is configured to be in contact with the circuit board and cover the noise source on the circuit board. The elastic grounding arms are connected to the covering body. The elastic grounding arms are configured to be in contact with the circuit board and respectively in electrical contact with a plurality of grounding areas of the circuit board.

According to the circuit board assembly and the shielding cover as discussed in the above embodiments, the elastic grounding arms of the shielding cover are connected to the covering body, the covering body is in contact with the upper surface of the circuit board and covers the noise source, and the elastic grounding arms are in contact with the lower surface of the circuit board and in electrical contact with the grounding areas of the circuit board, such that the shielding cover can be positioned on the circuit board and grounded simultaneously. Therefore, there is no need to arrange a metal clamp (or frame) on the circuit board for positioning and grounding the shielding cover, thereby preventing the circuit layout of the circuit board from being limited by such metal clamp (or frame) and reducing the burden of production, and saving cost.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
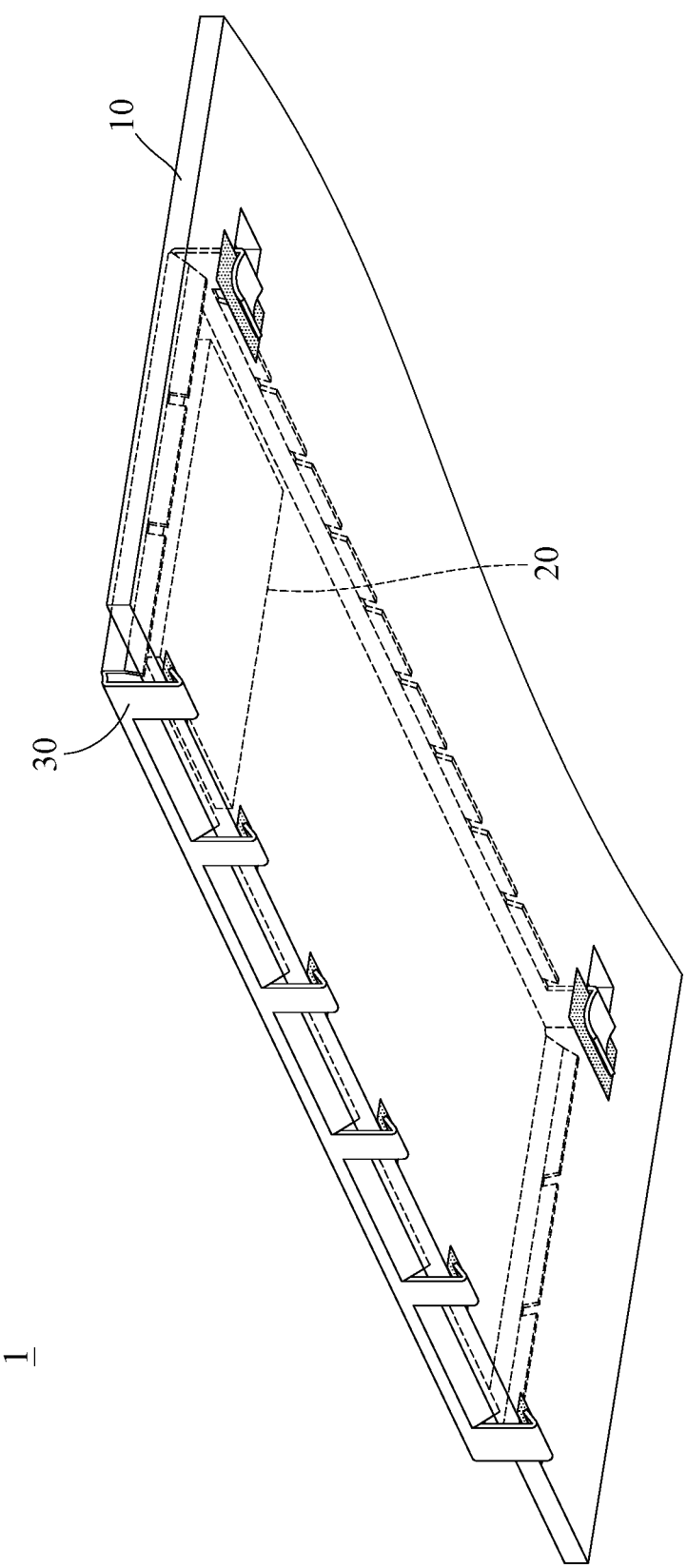
FIG. 1 is a perspective view of a circuit board assembly according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
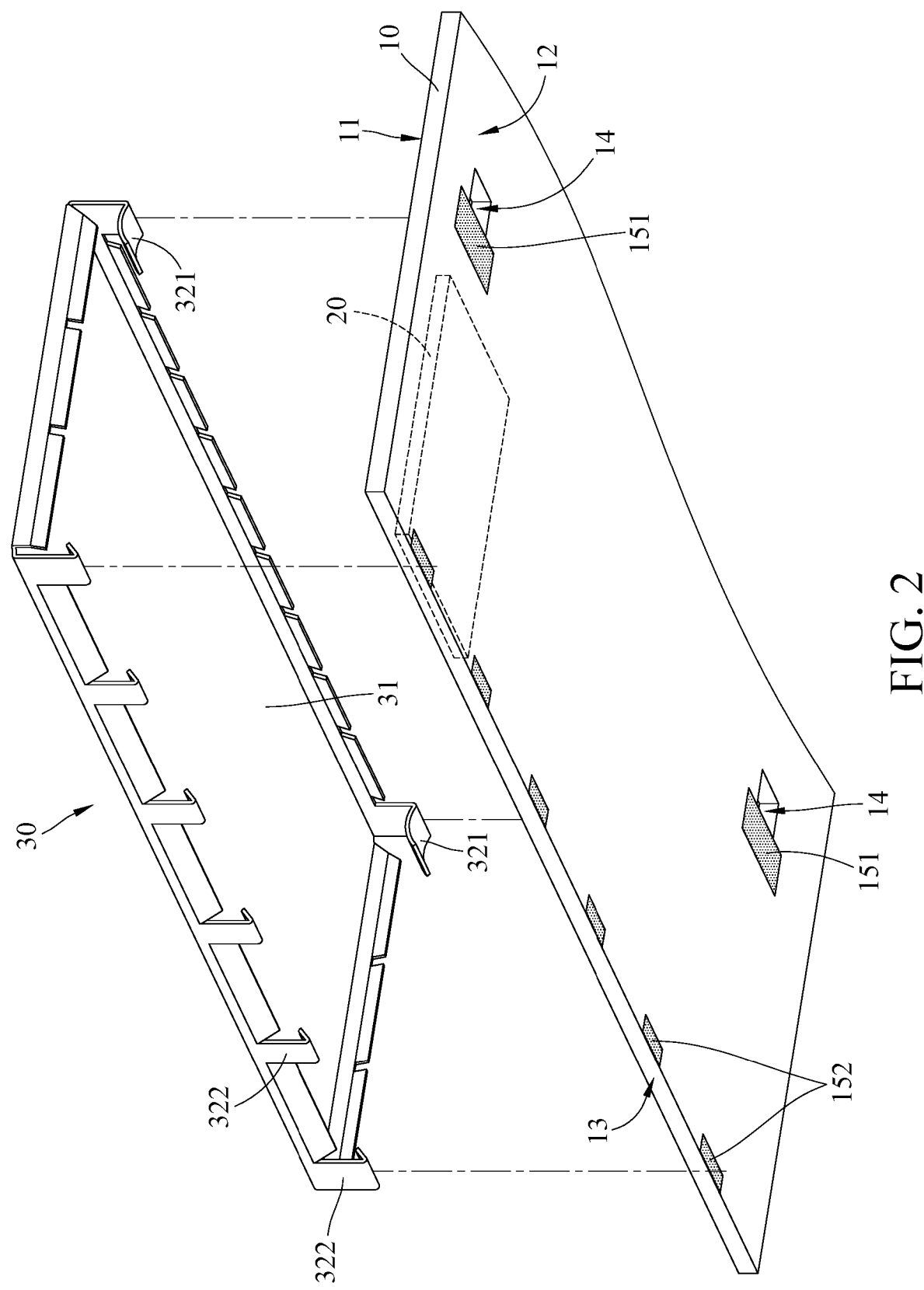
FIG. 2 is an exploded view of the circuit board assembly in FIG. 1.

Referring to FIGS. 1 and 2, FIG. 1 is a perspective view of a circuit board assembly 1 according to one embodiment of the invention, and FIG. 2 is an exploded view of the circuit board assembly 1 in FIG. 1.

In this embodiment, the circuit board assembly 1 includes a circuit board 10, a noise source 20 and a shielding cover 30.

The circuit board 10 has an upper surface 11, a lower surface 12, a side surface 13, two through holes 14 and a plurality of grounding areas 151 and 152. The lower surface 12 of the circuit board 10 faces away from the upper surface 11, and the side surface 13 is connected to the upper surface 11 and the lower surface 12. The two through holes 14 penetrate through the upper surface 11 and the lower surface 12 and are spaced apart from the side surface 13. The grounding areas 151 and 152 are located at the lower surface 12 of the circuit board 10, and the grounding areas 151 and 152 are portions of the circuit board 10 where the copper are exposed. The grounding areas 151 and 152, for example, include two first grounding areas 151 and six second grounding areas 152. The first grounding areas 151 are respectively located close to the through holes 14, and the second grounding areas 152 are located close to the side surface 13. The noise source 20 is disposed on the upper surface 11 of the circuit board 10.

Figure 3:
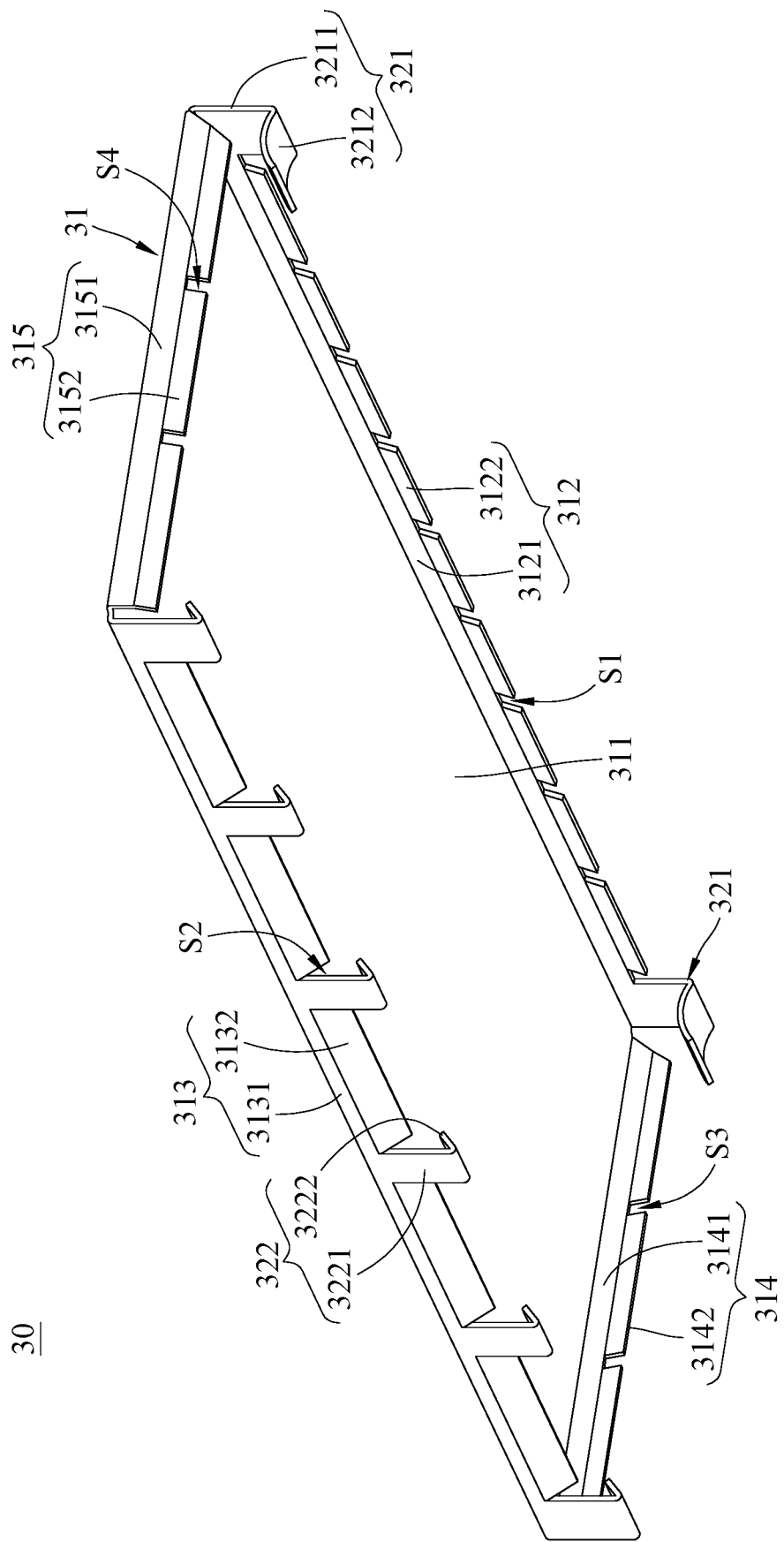
FIG. 3 is a perspective view of a shielding cover in FIG. 1.
Figure 4:
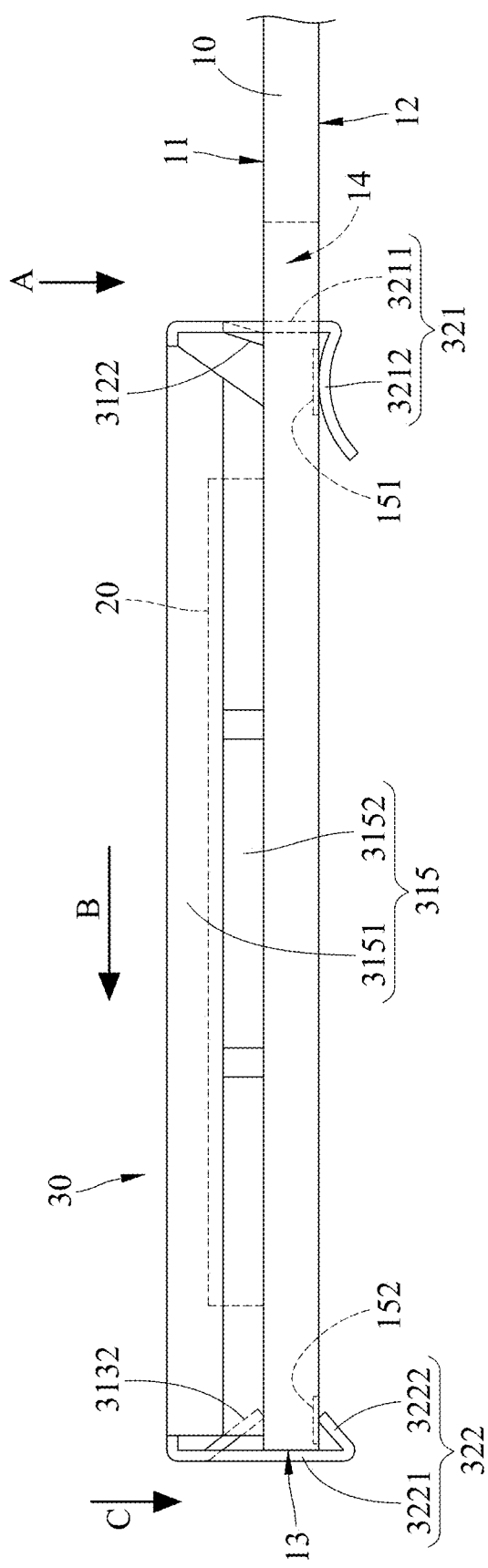
FIG. 4 is a side view of the circuit board assembly in FIG. 1.

Then, the following paragraphs will introduce the structure of the shielding cover 30. Referring to FIGS. 2 to 4, FIG. 3 is a perspective view of a shielding cover 30 in FIG. 1, and FIG. 4 is a side view of the circuit board assembly 1 in FIG. 1.

The shielding cover 30 includes a covering body 31 and a plurality of elastic grounding arms 321 and 322, and the covering body 31 and the elastic grounding arms 321 and 322 are, for example, made of a single piece. The covering body 31 includes a top plate 311, a first side plate 312, a second side plate 313, a third side plate 314 and a fourth side plate 315. The first side plate 312, the second side plate 313, the third side plate 314 and the fourth side plate 315 are respectively connected to different sides of the top plate 311, the first side plate 312 and the second side plate 313 are located opposite to each other, and the third side plate 314 and the fourth side plate 315 are located opposite to each other.

Specifically, the first side plate 312 includes a connection portion 3121 and a plurality of elastic support portions 3122, the second side plate 313 includes a connection portion 3131 and a plurality of elastic support portions 3132, the third side plate 314 includes a connection portion 3141 and a plurality of elastic support portions 3142, and the fourth side plate 315 includes a connection portion 3151 and a plurality of elastic support portions 3152. The elastic support portions 3122 of the first side plate 312, the elastic support portions 3132 of the second side plate 313, the elastic support portions 3142 of the third side plate 314 and the elastic support portions 3152 of the fourth side plate 315 are respectively connected to different sides of the top plate 311 via the connection portions 3121, 3131, 3141 and 3151.

The elastic grounding arms 321 and 322, for example, include two first elastic grounding arms 321 and six second elastic grounding arms 322. Each of the first elastic grounding arms 321 includes a first connection portion 3211 and a first contact portion 3212 connected to each other, where the first connection portion 3211 is in a flat shape, and the first contact portion 3212 is in a curved shape. The first connection portions 3211 of the first elastic grounding arms 321 are connected to the connection portion 3121 of the first side plate 312, and the elastic support portions 3122 of the first side plate 312 are located between the first elastic grounding arms 321. Each of the second elastic grounding arms 322 includes a second connection portion 3221 and a second contact portion 3222 connected to each other, where the second connection portion 3221 and the second contact portion 3222 both are in a flat shape, and the second connection portion 3221 is at an acute angle to the second contact portion 3222. The second connection portions 3221 of the second elastic grounding arms 322 are connected to the connection portion 3131 of the second side plate 313, and the second elastic grounding arm 322 are spaced apart from each other via the elastic support portions 3132 of the second side plate 313; that is, the second elastic grounding arms 322 and the elastic support portions 3132 of the second side plate 313 are in a staggered arrangement.

In this embodiment, the elastic support portions 3132 of the first side plate 312 are spaced apart from each other so as to form a plurality of first vent holes S1. A plurality of second vent holes S2 are formed between the elastic support portions 3132 of the second side plate 313 and the second elastic grounding arms 322. The elastic support portions 3142 of the third side plate 314 are spaced apart from each other so as to form a plurality of third vent holes S3. The elastic support portions 3152 of the fourth side plate 315 are spaced apart from each other so as to form a plurality of fourth vent holes S4. The first vent holes S1, the second vent holes S2, the third vent holes S3 and the fourth vent holes S4 are configured for air to flow into or out of the covering body 31 to cool the noise source 20.

During the installation of the shielding cover 30 to the circuit board 10, the first elastic grounding arms 321 are firstly disposed through the through holes 14 of the circuit board 10 along a direction A, such that the first contact portions 3212 of the first elastic grounding arms 321 are located at one side of the circuit board 10 where the lower surface 12 faces. Then, the shielding cover 30 is moved along a direction B, such that the first connection portions 3211 of the first elastic grounding arms 321 are in contact with edges of the through holes 14 so as to position one side of the shielding cover 30 on the circuit board 10. Then, another side of the shielding cover 30 is pressed downwards along a direction C, such that the second elastic grounding arms 322 pass through the side surface 13 of the circuit board 10, and the second contact portions 3222 of the second elastic grounding arms 322 are located at one side of the circuit board 10 where the lower surface 12 faces. As a result, the first contact portions 3212 of the first elastic grounding arms 321 are in contact with the lower surface 12 of the circuit board 10 and in electrical contact with the first grounding areas 151, the second contact portions 3222 of the second elastic grounding arms 322 are in contact with the lower surface 12 of the circuit board 10 and in electrical contact with the second grounding areas 152, and the elastic support portions 3122, 3132, 3142 and 3152 of the first side plate 312, the second side plate 313, the third side plate 314 and the fourth side plate 315 are all in contact with the upper surface 11 of the circuit board 10, such that the shielding cover 30 is fixed on the circuit board 10.

In this embodiment, the elastic grounding arms 321 and 322 of the shielding cover 30 are connected to the covering body 31, the covering body 31 is in contact with the upper surface 11 of the circuit board 10 and covers the noise source 20, and the elastic grounding arms 321 and 322 are in contact with the lower surface 12 of the circuit board 10 and in electrical contact with the grounding areas 151 and 152 of the circuit board 10, such that the shielding cover 30 can be positioned on the circuit board 10 and grounded simultaneously. Therefore, there is no need to arrange a metal clamp (or frame) on the circuit board 10 for positioning and grounding the shielding cover 30, thereby preventing the circuit layout of the circuit board 10 from being limited by such metal clamp (or frame) and reducing the burden of production, and saving cost. Also, the covering body 31 of the shielding cover 30 can be located on the upper surface 11 of the circuit board 10 as close as possible for improving the shielding effect of the shielding cover 30 to the noise source 20. Moreover, it is easy to install and remove the shielding cover 30, thereby facilitating the installation and maintenance.

In this embodiment, the elastic support portions 3122, 3132, 3142 and 3152 of the first side plate 312, the second side plate 313, the third side plate 314 and the fourth side plate 315, the first contact portions 3212 of the first elastic grounding arms 321, and the second contact portions 3222 of the second elastic grounding arms 322 together clamp the upper surface 11 and the lower surface 12 of the circuit board 10, such that the first contact portions 3212 and the second contact portions 3222 can be stably in electrical contact with the first grounding areas 151 and the second grounding areas 152 of the circuit board 10.

Note that the elastic support portions 3122, 3132, 3142 and 3152 of the first side plate 312, the second side plate 313, the third side plate 314 and the fourth side plate 315 are optional structures; in some other embodiments, all of the first side plate, the second side plate, the third side plate and the fourth side plate may not have the elastic support portions, and all of them may be flat plate structures and in contact with the upper surface of the circuit board.

Note that the quantities of the first elastic grounding arms 321 and the second elastic grounding arms 322 are not restricted in the invention and may be modified according to actual requirements. Correspondingly, the quantities of the first grounding areas and the second grounding areas of the circuit board may be modified.

In addition, the first elastic grounding arms 321 are not restricted to being disposed through the through holes 14 of the circuit board 10, and the second elastic grounding arms 322 are not restricted to passing through the side surface 13 of the circuit board 10; in some other embodiments, the first elastic grounding arms and the second elastic grounding arms may respectively pass through two opposite side surfaces of the circuit board, or the first elastic grounding arms and the second elastic grounding arms may be respectively disposed through holes of the circuit board located opposite to each other. Alternatively, the first elastic grounding arms may pass through the side surface of the circuit board, and the second elastic grounding arms may be disposed through the though holes of the circuit board.

In addition, the first contact portions 3212 of the first elastic grounding arms 321 are not restricted to being in the curved shape, and the second contact portions 3222 of the second elastic grounding arms 322 are not restricted to being in the flat shape; in some other embodiments, the first contact portions of the first elastic grounding arms and the second contact portions of the second elastic grounding arms may both be in the curved shape or flat shape. Alternatively, the first contact portions of the first elastic grounding arms may be in the flat shape, and the second contact portions of the second elastic grounding arms may be in the curved shape.

Moreover, the first elastic grounding arms 321 and the second elastic grounding arms 322 are not restricted to being connected to the first side plate 312 and the second side plate 313 of the covering body 31 located opposite to each other; in some other embodiments, the first elastic grounding arms and the second elastic grounding arms may be respectively connected to two side plates located adjacent to each other, or the first elastic grounding arms and the second elastic grounding arms may be connected to the same side plate.

According to the circuit board assembly and the shielding cover as discussed in the above embodiments, the elastic grounding arms of the shielding cover are connected to the covering body, the covering body is in contact with the upper surface of the circuit board and covers the noise source, and the elastic grounding arms are in contact with the lower surface of the circuit board and in electrical contact with the grounding areas of the circuit board, such that the shielding cover can be positioned on the circuit board and grounded simultaneously. Therefore, there is no need to arrange a metal clamp (or frame) on the circuit board for positioning and grounding the shielding cover, thereby preventing the circuit layout of the circuit board from being limited by such metal clamp (or frame) and reducing the burden of production, and saving cost. Also, the covering body of the shielding cover can be located on the upper surface of the circuit board as close as possible for improving the shielding effect of the shielding cover to the noise source. Moreover, it is easy to install and remove the shielding cover, thereby facilitating the installation and maintenance.

In addition, the elastic support portions of the first side plate, the second side plate, the third side plate and the fourth side plate, the first contact portions of the first elastic grounding arms, and the second contact portions of the second elastic grounding arms together clamp the upper surface and the lower surface of the circuit board, such that the first contact portions and the second contact portions can be stably in electrical contact with the first grounding areas and the second grounding areas of the circuit board.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A circuit board assembly, comprising:
   a circuit board, having an upper surface, a lower surface and a plurality of grounding areas, wherein the lower surface faces away from the upper surface, and the plurality of grounding areas are located at the lower surface;
   a noise source, located at the upper surface of the circuit board; and
   a shielding cover, comprising:
      a covering body, in contact with the upper surface and covering the noise source; and
      a plurality of elastic grounding arms, connected to the covering body, wherein the plurality of elastic grounding arms are in contact with the lower surface of the circuit board and respectively in electrical contact with the plurality of grounding areas;
   wherein the plurality of elastic grounding arms comprises at least one first elastic grounding arm and at least one second elastic grounding arm, and the at least one first elastic grounding arm and the at least one second elastic grounding arm are respectively connected to two opposite sides of the covering body;
   wherein the at least one first elastic grounding arm comprises a first connection portion and a first contact portion connected to each other, the first connection portion is connected to the covering body, the first contact portion is in a curved shape and in contact with the lower surface of the circuit board, the at least one second elastic grounding arm comprises a second connection portion and a second contact portion connected to each other, the second connection portion is connected to the covering body, and the second contact portion is in a flat shape and in contact with the lower surface of the circuit board.

2. The circuit board assembly according to claim 1, wherein the circuit board further has a side surface and at least one through hole, the side surface is connected to the upper surface and the lower surface, the at least one through hole penetrates through the upper surface and the lower surface and is spaced apart from the side surface, the at least one first elastic grounding arm is disposed through the at least one through hole and in contact with the lower surface of the circuit board, and the at least one second elastic grounding arm passes through the side surface of the circuit board and is in contact with the lower surface.

3. The circuit board assembly according to claim 2, wherein the quantity of the at least one first elastic grounding arm is two, the quantity of the at least one through hole is two through holes, and the quantity of the at least one second elastic grounding arm is larger than two.

4. The circuit board assembly according to claim 3, wherein the covering body comprises a top plate, a first side plate, a second side plate, a third side plate and a fourth side plate, each of the first side plate, the second side plate, the third side plate and the fourth side plate comprises a connection portion and a plurality of elastic support portions, the plurality of elastic support portions of the first side plate, the second side plate, the third side plate and the fourth side plate are respectively connected to different sides of the top plate via the connection portions, the two first elastic grounding arms are connected to the connection portion of the first side plate, the plurality of elastic support portions of the first side plate are located between the two first elastic grounding arms and spaced apart from each other so as to form a plurality of first vent holes, the second elastic grounding arms are connected to the connection portion of the second side plate, the second elastic grounding arms are spaced apart from each other via the plurality of elastic support portions of the second side plate, a plurality of second vent holes are formed between the second elastic grounding arms and the plurality of elastic support portions of the second side plate, the plurality of elastic support portions of the third side plate are spaced apart from each other so as to form a plurality of third vent holes, and the plurality of elastic support portions of the fourth side plate are spaced apart from each other so as to form a plurality of fourth vent holes.

5. The circuit board assembly according to claim 1, wherein the covering body and the plurality of elastic grounding arms are made of a single piece.

6. A shielding cover, configured to cover a noise source on a circuit board, comprising:
   a covering body, configured to be in contact with the circuit board and cover the noise source on the circuit board; and
   a plurality of elastic grounding arms, connected to the covering body, wherein the plurality of elastic grounding arms are configured to be in contact with the circuit board and respectively in electrical contact with a plurality of grounding areas of the circuit board;
   wherein the plurality of elastic grounding arms comprises at least one first elastic grounding arm and at least one second elastic grounding arm, and the at least one first elastic grounding arm and the at least one second elastic grounding arm are respectively connected to two opposite sides of the covering body;
   wherein the at least one first elastic grounding arm comprises a first connection portion and a first contact portion connected to each other, and the first connection portion is connected to the covering body, the first contact portion is in a curved shape, the at least one second elastic grounding arm comprises a second connection portion and a second contact portion connected to each other, the second connection portion is connected to the covering body, and the second contact portion is in a flat shape.

\* \* \* \* \*